(12) United States Patent
Lin (10) Patent No.: US 10,325,873 B2
(45) Date of Patent: Jun. 18, 2019

(54) CHIP-STACK STRUCTURE

(71) Applicant: United Microelectronics Corp., Hsinchu (TW)

(72) Inventor: Ming-Tse Lin, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 106 days.

(21) Appl. No.: 15/673,223

(22) Filed: Aug. 9, 2017

(65) Prior Publication Data

US 2019/0027457 A1   Jan. 24, 2019

(30) Foreign Application Priority Data

Jul. 21, 2017   (CN) .......................... 2017 1 0600400

(51) Int. Cl.
| | |
|---|---|
| *H01L 25/04* | (2014.01) |
| *H01L 25/07* | (2006.01) |
| *H01L 25/11* | (2006.01) |
| *H01L 23/00* | (2006.01) |
| *H01L 25/065* | (2006.01) |
| *H05K 3/46* | (2006.01) |
| *H01L 25/075* | (2006.01) |

(52) U.S. Cl.
CPC .............. *H01L 24/20* (2013.01); *H01L 24/26* (2013.01); *H01L 24/97* (2013.01); *H01L 25/0657* (2013.01); *H05K 3/4602* (2013.01); *H01L 25/043* (2013.01); *H01L 25/074* (2013.01); *H01L 25/0756* (2013.01); *H01L 25/117* (2013.01); *H01L 2224/04* (2013.01); *H01L 2924/1511* (2013.01)

(58) Field of Classification Search
CPC .......................... H01L 25/043; H01L 25/0657; H01L 25/074; H01L 25/0756; H01L 25/117

See application file for complete search history.

(56) References Cited

U.S. PATENT DOCUMENTS

| | | | |
|---|---|---|---|
| 7,626,257 B2 | 12/2009 | Knorr | |
| 8,298,860 B2 * | 10/2012 | Gambino | ............ G06F 17/5068 257/E21.506 |

(Continued)

OTHER PUBLICATIONS

DoHyeong Kim et al.,"Optimization and Challenges on TSV MEOL Integration", 2014 Electronic Components & Technology Conference, May 27-30, 2014, pp. 582-589.

*Primary Examiner* — Ida M Soward
(74) *Attorney, Agent, or Firm* — J.C. Patents (57) ABSTRACT

A chip-stack structure including a first chip and a second chip located on the first chip is provided. The first chip includes a first substrate, a first interconnect structure, a first pad, and a first contact conductor. The first interconnect structure is located on a first surface of the first substrate. The first pad is located on the first interconnect structure. The first contact conductor is located in the first substrate and exposed on a second surface of the first substrate opposite to the first surface. The second chip includes a second substrate, a second interconnect structure, a second pad, and a second contact conductor. The second interconnect structure is located on the second substrate. The second pad is located on the second interconnect structure. The second contact conductor is located in the second substrate, wherein the first contact conductor is directly physically in contact with the second pad.

14 Claims, 7 Drawing Sheets

(56) References Cited

U.S. PATENT DOCUMENTS

| | | | |
|---|---|---|---|
| 8,487,444 B2* | 7/2013 | Law | H01L 21/76898 |
| | | | 257/686 |
| 9,159,674 B2* | 10/2015 | Farooq | B32B 15/20 |
| 9,318,471 B2* | 4/2016 | Kabe | H01L 21/76898 |
| 9,449,914 B2* | 9/2016 | Ho | H01L 24/24 |
| 9,553,080 B1 | 1/2017 | England et al. | |
| 9,564,420 B2* | 2/2017 | Yu | H01L 23/3128 |
| 9,741,687 B2* | 8/2017 | Shih | H01L 21/76805 |
| 2009/0283871 A1 | 11/2009 | Chang et al. | |
| 2010/0171203 A1* | 7/2010 | Chen | H01L 23/585 |
| | | | 257/686 |
| 2012/0187576 A1* | 7/2012 | Yu | H01L 21/8221 |
| | | | 257/777 |
| 2013/0171773 A1* | 7/2013 | Farooq | H01L 21/2007 |
| | | | 438/107 |
| 2016/0133665 A1* | 5/2016 | Takahashi | H01L 21/76898 |
| | | | 257/432 |
| 2017/0033085 A1* | 2/2017 | Shikibu | H01L 25/0657 |
| 2017/0092626 A1* | 3/2017 | Yuan | H01L 25/074 |
| 2017/0162507 A1* | 6/2017 | Das | H01L 23/5383 |
| 2017/0186798 A1* | 6/2017 | Yang | H01L 27/14634 |

\* cited by examiner

CHIP-STACK STRUCTURE

CROSS REFERENCE TO RELATED APPLICATION

This application claims the priority benefit of China application serial no. 201710600400.X, filed on Jul. 21, 2017. The entirety of the above-mentioned patent application is hereby incorporated by reference herein and made a part of specification.

BACKGROUND OF THE INVENTION

Field of the Invention

The invention relates to a semiconductor structure and a manufacturing method thereof, and more particularly, to a chip-stack structure and a manufacturing method of a die-stack structure.

Description of Related Art

With the advancement of electronic manufacturing techniques, more and more electronic products are developed to be portable, highly functional, and compact and lightweight, such that the functionality of the chips used in conjunction and the electronic devices thereof are also bound to be more numerous and complex. Under this requirement, the design of a three-dimensional integrated circuit (3D IC) is becoming popular.

However, 3D IC not only faces relevant technical issues such as wafer thinning and chip stacking, the front-end and back-end processes of the IC also have issues hidden in manufacture details, and the high cost and low production yield thereof are the main issues of this technology. Therefore, how to reduce the production cost of 3D IC and increase the process yield thereof is an important topic for those skilled in the art.

SUMMARY OF THE INVENTION

The invention provides a chip-stack structure and a manufacturing method of a die-stack structure having a simple process and high process yield.

An embodiment of the invention provides a chip-stack structure including a first chip and a second chip. The second chip is located on the first chip. The first chip includes a first substrate, a first interconnect structure, a first pad, and a first contact conductor. The first interconnect structure is located on a first surface of the first substrate. The first pad is located on the first interconnect structure. The first contact conductor is located in the first substrate and exposed on a second surface of the first substrate opposite to the first surface. The second chip includes a second substrate, a second interconnect structure, a second pad, and a second contact conductor. The second interconnect structure is located on the second substrate. The second pad is located on the second interconnect structure. The second contact conductor is located in the second substrate, wherein the first contact conductor is directly physically in contact with the second pad.

In an embodiment of the invention, the first contact conductor does not cover the second surface of the first substrate.

In an embodiment of the invention, a carrier plate located below the first chip is further included.

In an embodiment of the invention, the carrier plate includes a carrier chip, and the first pad of the first chip is connected to a pad of the carrier chip.

In an embodiment of the invention, the thickness of the carrier chip is greater than the thickness of the first chip.

In an embodiment of the invention, a dielectric layer located between the first chip and the second chip is further included.

In an embodiment of the invention, the active surface of the second chip faces the back of the first chip.

Another embodiment of the invention provides a chip-stack structure including a first chip and a second chip. The second chip is located on the first chip. The first chip includes a first substrate, a first interconnect structure, a first pad, and a first contact conductor. The first interconnect structure is located on a first surface of the first substrate. The first pad is located on the first interconnect structure. The first contact conductor is located in the first substrate and exposed on a second surface of the first substrate opposite to the first surface. The second chip includes a second substrate, a second interconnect structure, a second pad, and a second contact conductor. The second interconnect structure is located on the second substrate. The second pad is located on the second interconnect structure. The second contact conductor is located in the second substrate, wherein the first contact conductor is directly physically in contact with the second pad, the first contact conductor has a width A, the second pad has a width B, and $5 \leq B/A$.

In an embodiment of the invention, the first contact conductor does not cover the second surface of the first substrate.

In an embodiment of the invention, a carrier plate located below the first chip is further included.

In an embodiment of the invention, the carrier plate includes a carrier chip, and the first pad of the first chip is connected to a pad of the carrier chip.

In an embodiment of the invention, the thickness of the carrier chip is greater than the thickness of the first chip.

In an embodiment of the invention, a dielectric layer located between the first chip and the second chip is further included.

In an embodiment of the invention, the active surface of the second chip faces the back of the first chip.

An embodiment of the invention provides a manufacturing method of a die-stack structure including the following steps. A first wafer is provided, wherein the first wafer includes a first die, the first die includes a first substrate material layer and a first interconnect structure and a first pad formed on the first substrate material layer in order, and a first contact conductor is embedded in the first substrate material. A second wafer is provided, wherein the second wafer includes a second die, the second die includes a second substrate material layer and a second interconnect structure and a second pad formed on the second substrate material layer in order, and a second contact conductor is embedded in the second substrate material. A portion of the first substrate material layer is removed to form a first substrate, and the first contact conductor is exposed on the surface of the first substrate away from the first interconnect structure. The second wafer is brought into contact with the first wafer such that the first contact conductor is directly physically in contact with the second pad.

In an embodiment of the invention, the first contact conductor does not cover the surface of the first substrate away from the first interconnect structure.

In an embodiment of the invention, before a portion of the first substrate material layer is removed, the first wafer is further disposed on the carrier plate.

In an embodiment of the invention, the carrier plate includes a carrier wafer, and the carrier wafer includes a third die, wherein the first pad of the first die is connected to a pad of the third die.

In an embodiment of the invention, the active surface of the second die faces the back of the first die.

In an embodiment of the invention, after a portion of the first substrate material layer is removed, a dielectric layer is further formed on the surface of the first substrate away from the first interconnect structure, wherein the dielectric layer exposes the first contact conductor.

Based on the above, in the chip-stack structure and the manufacturing method of the die-stack structure provided in the embodiments of the invention, since the first contact conductor is directly physically in contact with the second pad, a pad for connecting the first contact conductor and the second pad does not need to be formed on the second surface of the first substrate, such that the process can be simplified, and the process yield of the chip-stack structure can be increased and production cost thereof can be reduced.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is more comprehensively described with reference to the figures of the present embodiments. However, the invention can also be implemented in various different forms, and is not limited to the embodiments in the present specification. The thicknesses of the layers and regions in the figures are enlarged for clarity. The same or similar reference numerals represent the same or similar devices and are not repeated in the following paragraphs.

Figure 2:
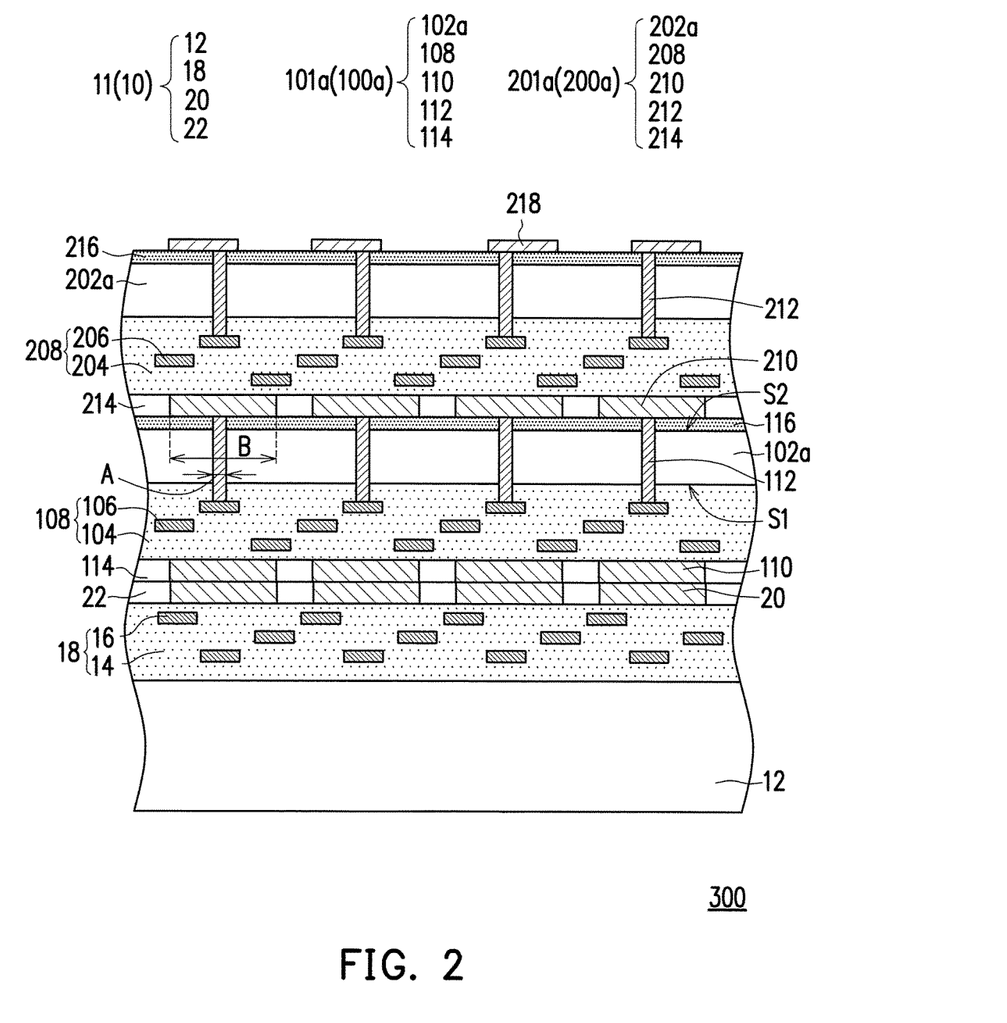
FIG. 2 is a cross section of a die-stack structure according to another embodiment of the invention.
Figure 3:
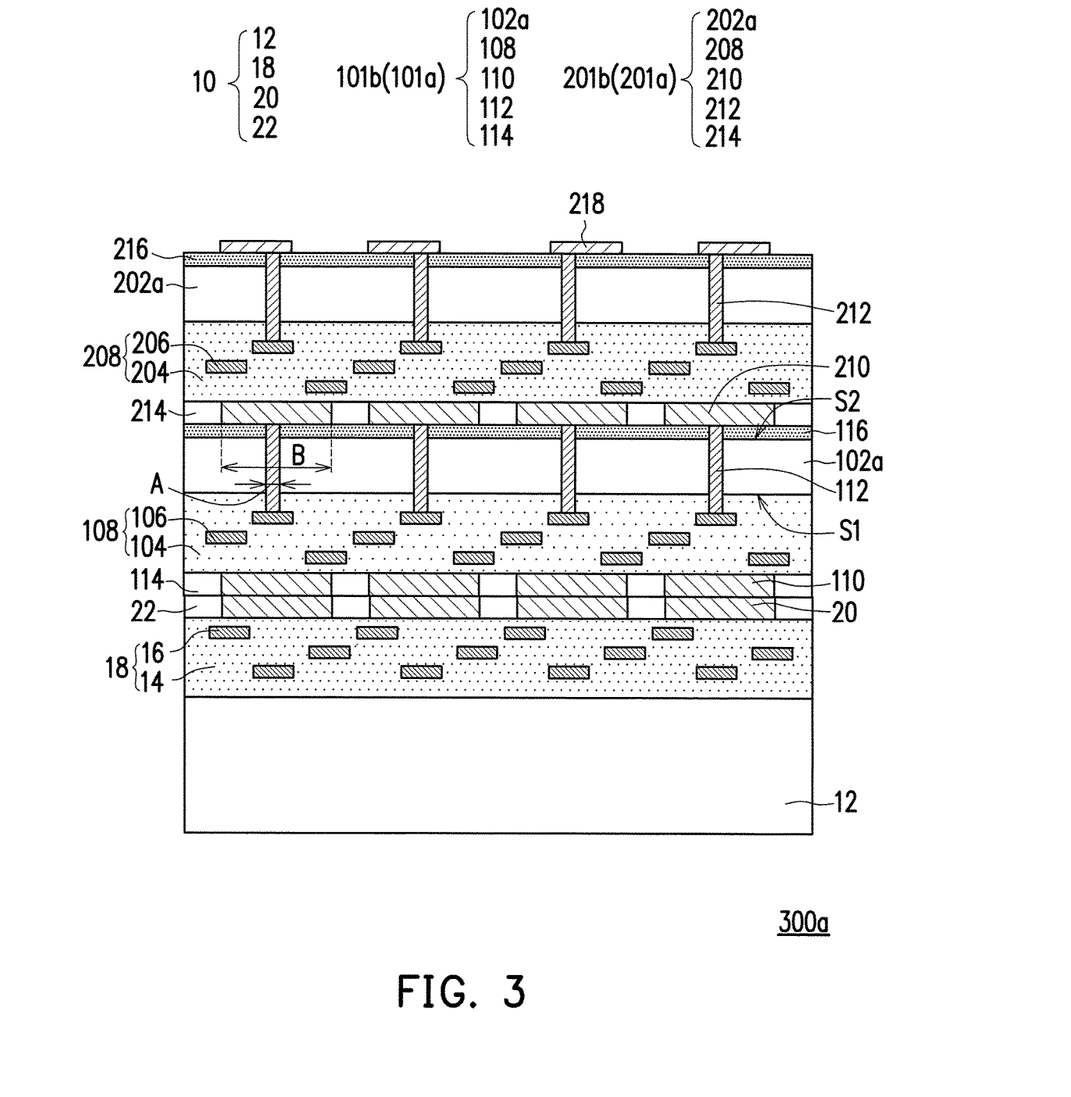
FIG. 3 is a cross section of a chip-stack structure according to another embodiment of the invention.

FIG. 1A to FIG. 1E are cross sections of a manufacturing method of a die-stack structure according to an embodiment of the invention. FIG. 2 is a cross section of a die-stack structure according to another embodiment of the invention. FIG. 3 is a cross section of a chip-stack structure according to another embodiment of the invention.

Figure 1A:
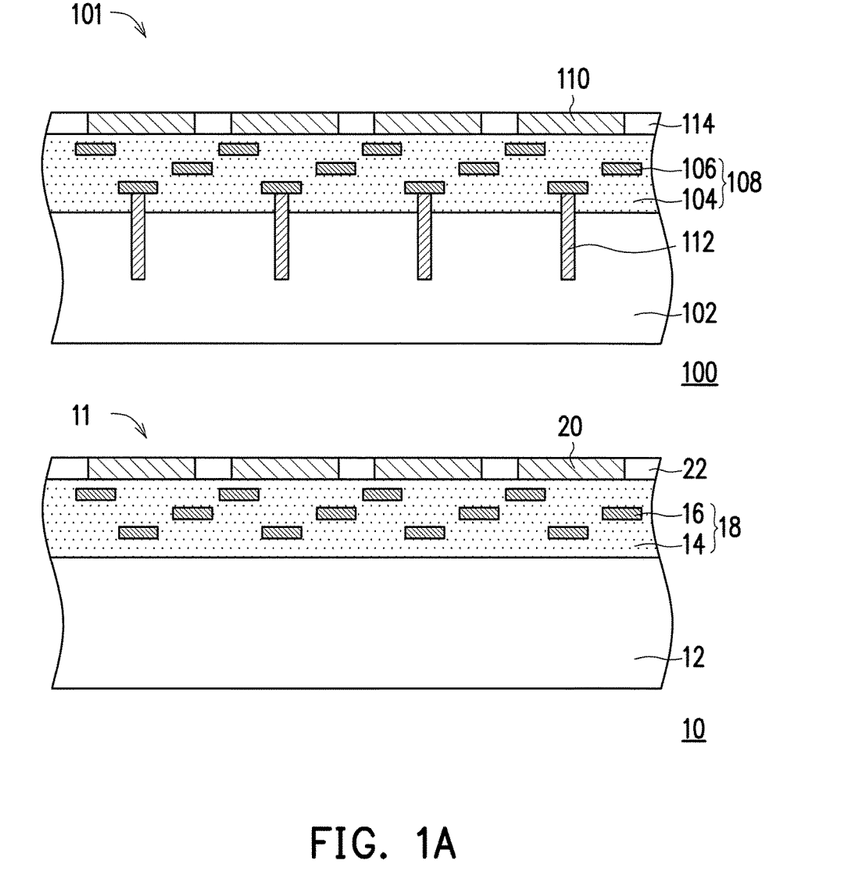
FIG. 1A to FIG. 1E are cross sections of a manufacturing method of a die-stack structure according to an embodiment of the invention.

Referring to FIG. 1A, a wafer 100 is provided. The wafer 100 includes a plurality of dies, and FIG. 1A only shows one of the dies 101 (i.e., first die). The die 101 includes a substrate material layer 102, an interconnect structure 108, a pad 110, a contact conductor 112, and a dielectric layer 114. The substrate material layer 102 includes a semiconductor substrate. The semiconductor substrate is, for instance, a doped silicon substrate, an undoped silicon substrate, or a silicon-on-insulator (SOI) substrate. The doped silicon substrate can be P-type doped, N-type doped, or a combination thereof. In some embodiments, an active device such as a charge-coupled device (CCD), P-type metal-oxide-semiconductor (PMOS) transistor, N-type metal-oxide-semiconductor (NMOS) transistor, complementary metal-oxide-semiconductor (CMOS) transistor, photodiode, or a combination thereof can be disposed in and/or on the substrate material layer 102. A passive device such as a capacitor, resistor, inductor, or a combination can also be disposed on the substrate material layer 102. In some embodiments, the substrate material layer 102 further includes an inter-layer dielectric, (ILD) and/or a contact, but the invention is not limited thereto.

The interconnect structure 108 is formed on the substrate material layer 102. The interconnect structure 108 includes a dielectric layer 104 and a plurality of wires 106 formed in the dielectric layer 104. The dielectric layer 104 is, for instance, an inter-metal dielectric (IMD) layer, and the material thereof can be a dielectric material. For instance, the dielectric material can be silicon oxide, tetraethoxysilane (TEOS) silicon oxide, silicon nitride, silicon oxynitride, undoped silica glass (USG), borophosphosilicate glass (BPSG), phosphosilicate glass (PSG), a low-k material having a dielectric constant less than 4, or a combination thereof. The low-k material is, for instance, fluorosilicate glass (FSG), silsesquioxnane, aromatic hydrocarbon, organosilicate glass, parylene, fluoro-polymer, poly(arylether), porous polymer, or a combination thereof. The silsesquioxnane is, for instance, hydrogen silsesquioxnane (HSQ), methyl silsesquioxane (MSQ), or hybrido-organosiloxane polymer (HOSP). The aromatic hydrocarbon is, for instance, SiLK. The organosilicate glass is, for instance, carbon black (e.g., black diamond, BD), 3MS, or 4MS. The fluorinated polymer is, for instance, PFCB, CYTOP, or Teflon. The poly(arylether) is, for instance, PAE-2 or FLARE. The porous polymer is, for instance, XLK, nano-foam, Awrogel, or Coral. The forming method of the dielectric layer 104 is, for instance, atomic layer deposition (ALD), chemical vapor deposition (CVD), spin coating (SOG), or a combination thereof. The wires 106 include a conductive layer and/or a via, and the material thereof can be a conductive material. For instance, the conductive material can be metal, metal alloy, metal nitride, metal silicide, or a combination thereof. In some exemplary embodiments, the metal and metal alloy are, for instance, Cu, Al, Ti, Ta, W, Pt, Cr, Mo, or an alloy thereof. The metal nitride is, for instance, titanium nitride, tungsten nitride, tantalum nitride, tantalum silicon nitride (TaSiN), titanium silicon nitride (TiSiN), tungsten silicon nitride (WSiN), or a combination thereof. The metal silicide is, for instance, tungsten silicide, titanium silicide, cobalt silicide, zirconium silicide, platinum silicide, molybdenum silicide, copper silicide, nickel silicide, or a combination thereof. In some embodiments, the forming method of the wires 106 can be a single damascene process, a dual damascene process, or a combination thereof. The wires 106 electrically connect a(n) active device/passive device to a subsequent contact conductor 112 and/or pad 110.

A contact conductor 112 is disposed in the substrate material layer 102. The material of the contact conductor 112 can be a conductive material. For instance, the conductive material is metal alloy, metal nitride, metal silicide, or a combination thereof. In some exemplary embodiments, the metal and metal alloy are, for instance, Cu, Al, Ti, Ta, W, Pt, Cr, Mo, or an alloy thereof. The metal nitride is, for instance, titanium nitride, tungsten nitride, tantalum nitride, tantalum silicon nitride (TaSiN), titanium silicon nitride (TiSiN), tungsten silicon nitride (WSiN), or a combination thereof. The metal silicide is, for instance, tungsten silicide, titanium silicide, cobalt silicide, zirconium silicide, platinum silicide, molybdenum silicide, copper silicide, nickel silicide, or a combination thereof. In some embodiments, the contact conductor 112 is a through-silicon via (TSV), and based on the forming order, the forming method thereof can be substantially divided into a via-first process, a via-middle process, and a via-last process. For instance, in the via-first process, the contact conductor 112 is formed in the substrate material layer 102 before the front-end-of-line (FEOL) process of the wafer; in the via-last process, the contact conductor 112 is formed in the substrate material layer 102 after the back-end-of-the-line (BEOL) process of the wafer; and in the via-middle process, the contact conductor 112 is formed in the substrate material layer 102 between the FEOL and BEOL processes (i.e., middle-end-of-the-line (MEOL) process). In the present embodiment, the contact conductor 112 is formed in the substrate material layer 102 via a via-middle process and electrically insulated from the substrate material layer 102 via a dielectric material (not shown in figures), but the invention is not limited thereto, and the contact conductor 112 can also be formed in the substrate material layer 102 via a via-first process or a via-last process.

The pad 110 is formed on the interconnect structure 108. The material of the pad 110 can be a conductive material. For instance, the conductive material is, for instance, the metal, metal alloy, metal nitride, metal silicide, or a combination thereof as for contact conductor 112 described above. The forming method of the pad 110 is, for instance, a metal patterning process or a metal damascene process.

The dielectric layer 114 is formed on the interconnect structure 108 and exposes the pad 110. The material of the dielectric layer 114 can be the dielectric material as for the dielectric layer 104 described above. In some embodiments, the forming method of the dielectric layer 114 can include first forming a dielectric material layer (not shown) covering the pad 110 on the interconnect structure 108. Next, a portion of the dielectric material layer located on the pad 110 is removed to form the dielectric layer 114 exposing the pad 110. Alternatively, the forming method of the dielectric layer 114 can include first forming a dielectric material layer (not shown) on the interconnect structure 108, then removing the portion of the dielectric material layer where the pad 110 to be formed, and then forming the pad 110. In some embodiments, the dielectric material layer located on the pad 110 can be removed using a planarization process. The planarization process is, for instance, a chemical-mechanical polishing (CMP) process.

Referring further to FIG. 1A, a carrier plate 10 is provided. In some embodiments, the carrier plate 10 can be a carrier wafer similar to the wafer 100. In other words, the carrier plate 10 can also include a plurality of dies, and FIG. 1A shows one of the dies 11 (i.e., third die). The die 11 includes a substrate material layer 12, an interconnect structure 18 (including a dielectric layer 14 and wires 16), a pad 20, and a dielectric layer 22, and the relative positions, materials, and forming methods thereof are respectively as provided for the substrate material layer 102, the interconnect structure 108, the pad 110, and the dielectric layer 114 of the die 101 and are not repeated herein. In some embodiments, in the carrier plate 10 (carrier wafer), a contact conductor does not need to be formed in the substrate material layer 12, but the invention is not limited thereto.

Figure 1B:
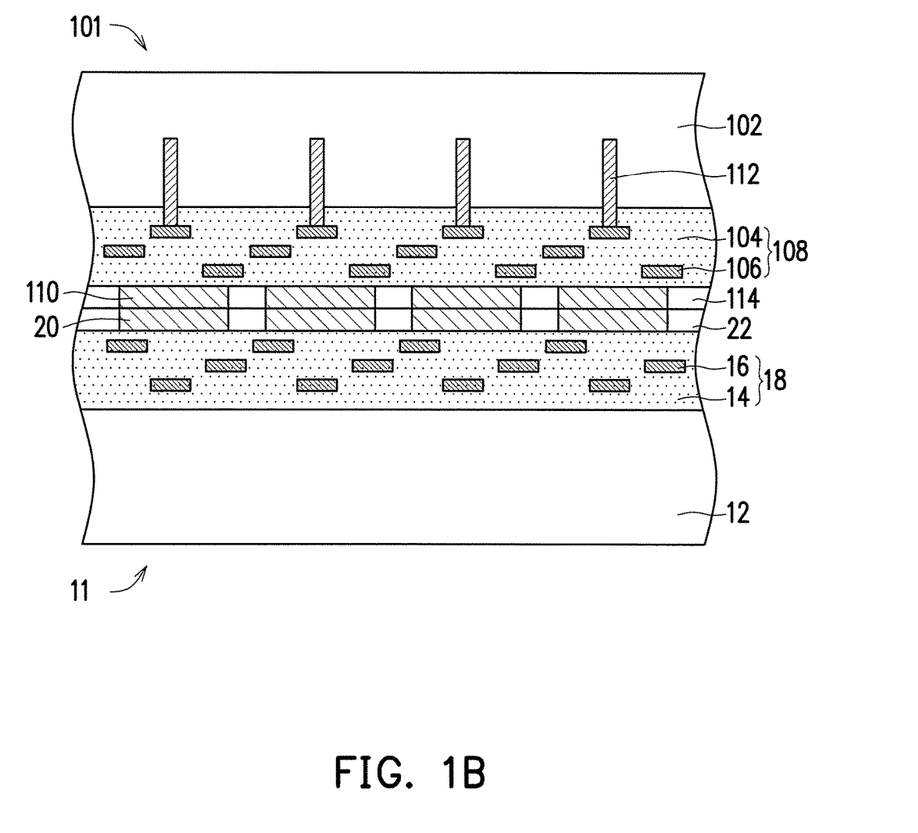

Referring to both FIG. 1A and FIG. 1B, the carrier plate 10 is covered by the wafer 100. In some embodiments, the carrier plate 10 can be a carrier wafer similar to the wafer 100, wherein the pad 110 of the die 101 faces the carrier plate 10 and is connected to the pad 20 of the die 11 of the carrier plate 10 (i.e., carrier wafer). As a result, since the carrier plate 10 is a wafer, the carrier plate 10 does not need to be removed in a subsequent process (a regular carrier plate for carrying a wafer does not have an active device and/or an interconnect structure, and is therefore removed in a subsequent process), and therefore not only can process be simplified and the cost of the carrier be eliminated, stacking density of the chip can be further increased. In some embodiments, the pad 110 of the die 101 can be connected to the pad 20 of the die 11 in the carrier plate 10 (i.e., carrier wafer) and the dielectric layer 114 of the die 101 can be connected to the dielectric layer 22 of the carrier plate 10 using a hybrid bond (HB) method.

Figure 1C:
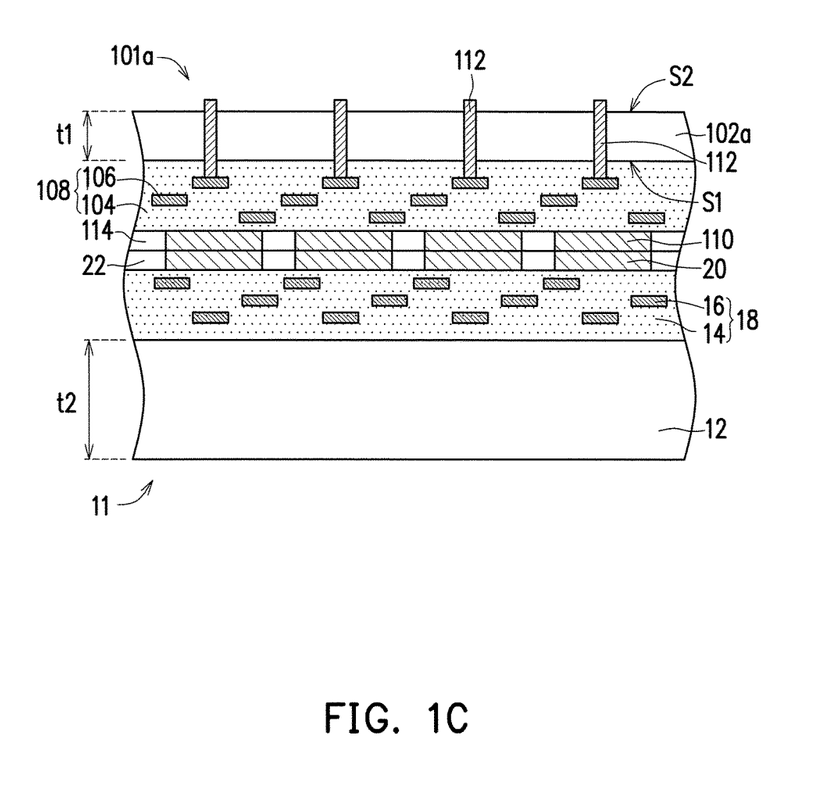

Referring to both FIG. 1B and FIG. 1C, a portion of the substrate material layer 102 is removed to form a substrate 102a, wherein the contact conductor 112 is exposed on and protruded from a second surface S2 of the substrate 102a. In some embodiments, the method of removing a portion of the substrate material layer 102 includes, in order, performing a thinning process and an etching process on the surface (i.e., back of the die 101) of the substrate material layer 102 away from the interconnect structure 108 such that the contact conductor 112 is exposed on and protruded from the second surface S2 of the substrate 102a. The thinning process includes, for instance, performing a grinding process on the surface of the substrate material layer 102 away from the interconnect structure 108. The etching process is, for instance, dry etching, wet etching, or a combination thereof. In some embodiments, the contact conductor 112 does not cover the surface (i.e., the second surface S2) of the substrate 102a away from the interconnect structure 108. Moreover, the thickness of the substrate 102a is less than the thicknesses of the substrate material layers 12 and 102. In some embodiments, the substrate 102a has a thickness t1, and 3 μm<t1<100 μm; and the substrate material layers 12 and 102 have a thickness t2, and t2 is about 775 μm. In other words, in the embodiment in which the carrier plate 10 is a carrier wafer, the thickness of the substrate material layer 12 thereof is greater than the thickness of the substrate 102a (i.e., the thickness of the carrier wafer (thickness of the die 11) is greater than the thickness of the die 101a), and therefore when the die 101a is carried thereon, the issue of difficult subsequent process thereon due to an insufficient thickness of the die 101a can still be prevented.

Figure 1D:
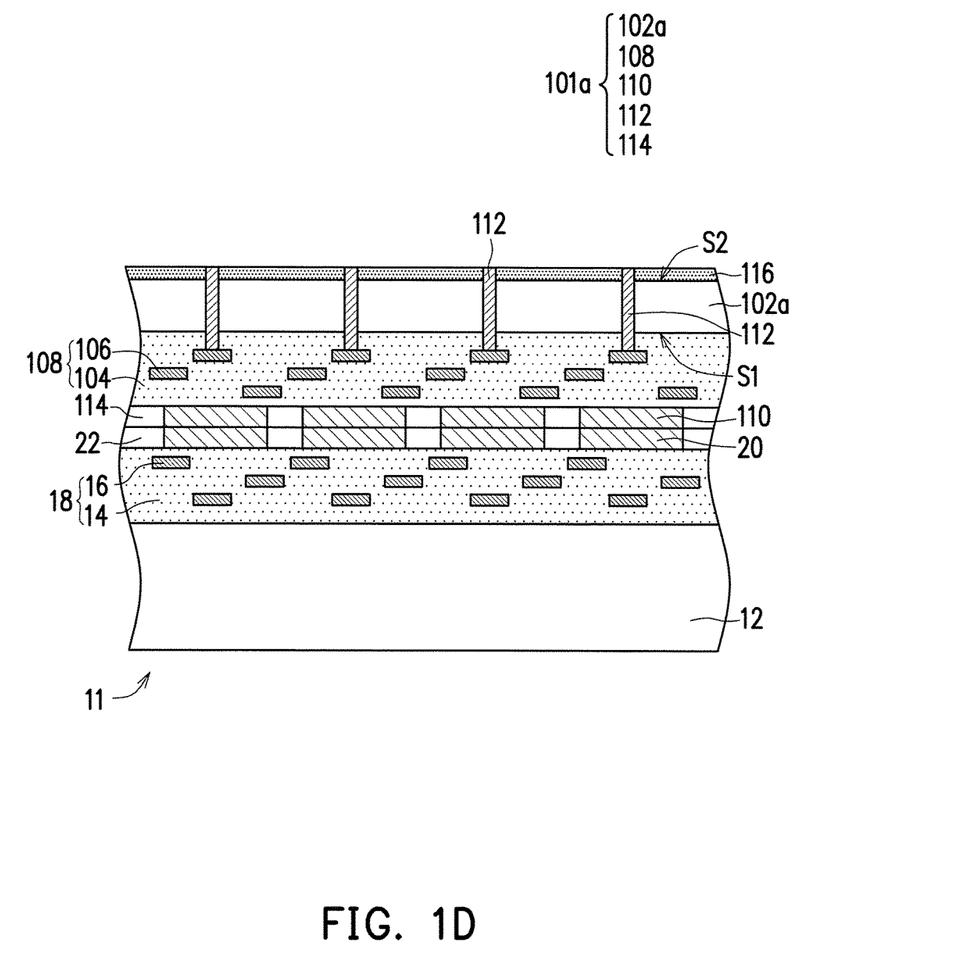

Referring to FIG. 1D, a dielectric layer 116 is framed on the second surface S2 of the substrate 102a, wherein the dielectric layer 116 exposes the first contact conductor 112. The material of the dielectric layer 116 is, for instance, a dielectric material. The dielectric material is, for instance, silicon oxide, tetraethoxysiloxane (TEOS) silicon oxide, undoped silica glass (USG), or a combination thereof. In some embodiments, the forming method of the dielectric layer 116 includes first forming a dielectric material layer (not shown) covering the contact conductor 112 on the second surface S2 of the substrate 102a. Next, a portion of the dielectric material layer located on the contact conductor 112 is removed to form a dielectric layer 116 exposing the contact conductor 112. The forming method of the dielectric material layer is, for instance, ALD, CVD, SOG, or a combination thereof. The method of removing the dielectric material layer located on the contact conductor 112 can be a planarization process such as CMP. In some embodiments, the top surface of the dielectric layer 116 and the top surface of the contact conductor 112 are coplanar, and the dielectric layer 116 surrounds the contact conductor 112 protruded from the second surface S2.

Figure 1E:
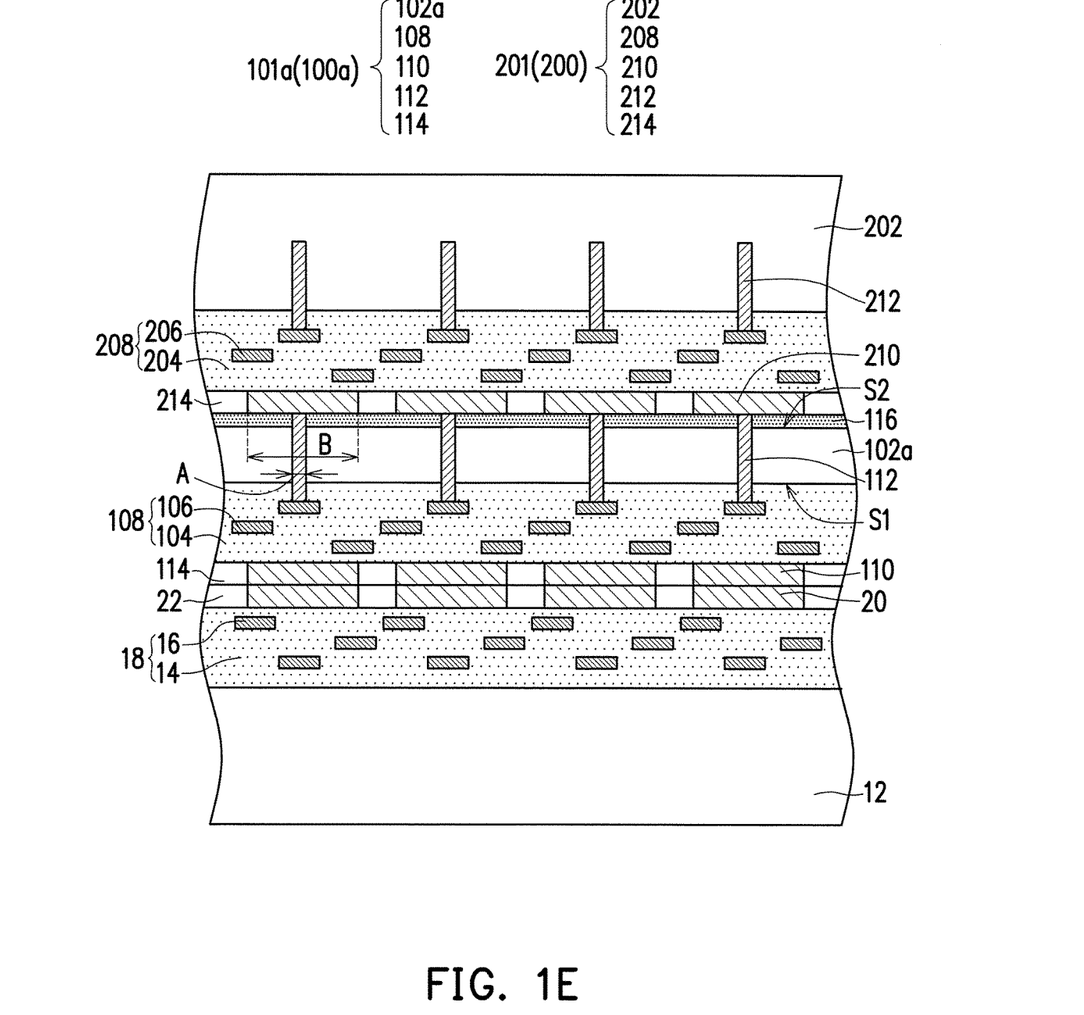

Referring to FIG. 1E, a wafer 200 is provided. The wafer 200 includes a plurality of dies, and FIG. 1E only shows one of the dies 201 (i.e., second die). The die 201 includes a substrate material layer 202, an interconnect structure 208 (including a dielectric layer 204 and wires 206), a pad 210, a contact conductor 212, and a dielectric layer 214. In some embodiments, the wafer 200 is similar to the wafer 100, and therefore the relative positions, materials, and forming methods of the substrate material layer 202, the interconnect structure 208, the pad 210, the contact conductor 212, and the dielectric layer 214 in the die 201 thereof are substantially similar to those of the substrate material layer 102, the interconnect structure 108, the pad 110, the contact conductor 112, and the dielectric layer 114 of the die 101 and are not repeated herein.

Next, the wafer 200 covers the wafer 100a such that the die 201 is docked with the die 101a, and the contact conductor 112 of the die 101a is directly physically in contact with the pad 210 of the die 201. As a result, another pad for connecting the contact conductor 112 and the pad 210 does not need to be formed on the dielectric layer 116, such that the process can be simplified and the process yield of the chip-stack structure can be increased and production cost thereof can be reduced as a result. In some embodiments, the contact conductor 112 of the die 101a can be directly physically connected to the pad 210 of the die 201 using a hybrid bonding method. In some embodiments, the contact conductor 112 has a width A; the pad 210 has a width B, and 5≤B/A, in particular 5≤B/A≤10, or even B/A>10. As a result, even if misalignment occurs to the contact conductor 112 and the pad 210, the contact conductor 112 can still be electrically connected to the pad 210 well without affecting other adjacent contact conductors 112 and/or pads 210 (for instance, being too close to the adjacent contact conductor 112 and/or the pad 210 results in a risk from an electron migration (EM) effect, such that a risk of short circuit is present). In the present embodiment, the active surface of the die 201 faces the back of the die 101a, that is, in the present embodiment, a back-to-front stacking method is exemplified, but the invention is not limited thereto. In some embodiments, a front-to-front or back-to-back stacking method can also be used. Moreover, referring to FIG. 1A and FIG. 1E, in the present embodiment, two wafers (wafers 100 and 200) are stacked on the carrier plate 10 as an example, but the invention is not limited thereto, and the process of, for instance, FIG. 1C to FIG. 1E, can be further performed on the wafer 200 to form a wafer 200a and stack one or a plurality of wafers thereon.

Referring to both FIG. 1E and FIG. 2, in the present embodiment, two wafers are stacked on the carrier plate 10 as an example, and therefore, the die 201 is the top-most die of the die-stack structure, but the invention is not limited thereto. The process of, for instance, FIG. 1C to FIG. 1D is performed on the die 201 to form a die 201a, and the contact conductor 212 thereof is exposed on and protruded from the surface of the substrate 202a away from the interconnect structure 208, and the dielectric layer 216 is formed on the surface of the substrate 102a away from the interconnect structure 208 and exposes the contact conductor 212. In an embodiment, the material and the forming method of the dielectric layer 216 are substantially similar to those of the dielectric layer 116 and are not repeated herein. Next, a redistribution layer (RDL) 218 is formed on the dielectric layer 216 to define the pad of the top-most die of a die-stack structure 300. The redistribution layer 218 is electrically connected to the corresponding contact conductor 212. The material of the redistribution layer 218 can be the conductive material as for the contact conductor 112 set forth above. For instance, the conductive material can be the metal, metal alloy, metal nitride, metal silicide, or a combination thereof.

Referring to FIG. 3, a singulation process is performed on the die-stack structure 300 to cut the die-stack structure 300 into a plurality of chip-stack structures 300a separated from one another. In the following, the chip-stack structure 300a of the present embodiment is described via FIG. 3. Moreover, although the manufacturing method of the chip-stack structure 300a of the present embodiment is exemplified by the manufacturing method above, the manufacturing method of the chip-stack structure 300a of the invention is not limited thereto.

Referring to FIG. 3, the chip-stack structure 300a includes a chip 101b (i.e., first chip) and a chip 201b (i.e., second chip). The chip 101b and the chip 201b respectively correspond to the die 101a and the die 201a (as shown in FIG. 2). The chip 201b is located on the chip 101b. The chip 101b includes a substrate 102a (first substrate), an interconnect structure 108 (first interconnect structure), a pad 110 (first pad), a contact conductor 112 (first contact conductor), and a dielectric layer 114. The interconnect structure 108 is located on a first surface S1 of the substrate 102a. The pad 110 is located on the interconnect structure 108. The contact conductor 112 is located in the substrate 102a and exposed on a second surface S2 of the substrate 102a opposite to the first surface S1. The chip 201b includes a substrate 202a (second substrate), an interconnect structure 208 (second interconnect structure), a pad 210 (second pad), a contact conductor 212 (second contact conductor), and a dielectric layer 214. The interconnect structure 208 is located on the substrate 202a. The pad 210 is located on the interconnect structure 208. The contact conductor 212 is located in the substrate 202a, wherein the contact conductor 112 of the chip 101b is directly physically in contact with the pad 210 of the chip 201b. The contact conductor 112 has a width A, the pad 210 has a width B, and 5≤B/A, such as 5≤B/A≤10, or even B/A>10. Moreover, the contact conductor 112 does not cover the second surface S2 of the substrate 102a. In some embodiments, the chip-stack structure 300a further includes a carrier plate 10 located below the chip 101b. In some embodiments, the carrier plate 10 is a carrier chip. The pad 110 of the chip 101b is connected to the pad 20 of the carrier plate 10 (i.e., the carrier chip), wherein the thickness of the carrier chip is greater than the thickness of the chip 101b. In some embodiments, the chip-stack structure 300a further includes a dielectric layer 116 located between the chip 101b and the chip 201b. In some embodiments, the active surface of the chip 201b faces the back of the chip 101b.

Based on the above, in the chip-stack structure and the manufacturing method thereof of the embodiments, since the first contact conductor of the first chip is directly physically in contact with the second pad of the second chip, a pad for connecting the first contact conductor and the second pad does not need to be formed on the second surface of the first substrate, such that the process can be simplified, and the process yield of the chip-stack structure can be increased and production cost thereof can be reduced.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A chip-stack structure, comprising:
   a first chip, comprising:
   a first substrate;
   a first interconnect structure located on a first surface of the first substrate;
   a first pad located on the first interconnect structure; and
   a first contact conductor located in the first substrate and exposed on a second surface of the first substrate opposite to the first surface; and
   a second chip located on the first chip, the second chip comprising:
   a second substrate;
   a second interconnect structure located on the second substrate;
   a second pad located on the second interconnect structure; and
   a second contact conductor located in the second substrate,
   wherein the first contact conductor is directly physically in contact with the second pad.

2. The chip-stack structure of claim 1, wherein the first contact conductor does not cover the second surface of the first substrate.

3. The chip-stack structure of claim 1, further comprising: a carrier plate located below the first chip.

4. The chip-stack structure of claim 3, wherein the carrier plate comprises a carrier chip, and the first pad of the first chip is connected to a pad of the carrier chip.

5. The chip-stack structure of claim 4, wherein a thickness of the carrier chip is greater than a thickness of the first chip.

6. The chip-stack structure of claim 1, further comprising:
   a dielectric layer located between the first chip and the second chip.

7. The chip-stack structure of claim 1, wherein an active surface of the second chip faces a back of the first chip.

8. A chip-stack structure, comprising:
   a first chip, comprising:
   a first substrate;
   a first interconnect structure located on a first surface of the first substrate;
   a first pad located on the first interconnect structure; and
   a first contact conductor located in the first substrate and exposed on a second surface of the first substrate opposite to the first surface; and
   a second chip located on the first chip, the second chip comprising:
   a second substrate;
   a second interconnect structure located on the second substrate;
   a second pad located on the second interconnect structure; and
   a second contact conductor located in the second substrate,
   wherein the first contact conductor is directly physically in contact with the second pad, the first contact conductor has a width A, the second pad has a width B, and $5 \leq B/A$.

9. The chip-stack structure of claim 8, wherein the first contact conductor does not cover the second surface of the first substrate.

10. The chip-stack structure of claim 8, further comprising:
    a carrier plate located below the first chip.

11. The chip-stack structure of claim 10, wherein the carrier plate comprises a carrier chip, and the first pad of the first chip is connected to a pad of the carrier chip.

12. The chip-stack structure of claim 11, wherein a thickness of the carrier chip is greater than a thickness of the first chip.

13. The chip-stack structure of claim 8, further comprising:
    a dielectric layer located between the first chip and the second chip.

14. The chip-stack structure of claim 8, wherein an active surface of the second chip faces a back of the first chip.

* * * * *